(12) United States Patent  
Bennett

(10) Patent No.: US 7,733,189 B1  
(45) Date of Patent: Jun. 8, 2010

(54) OSCILLATOR COMPRISING FOLDOVER DETECTION

(75) Inventor: George J. Bennett, Murrieta, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 33 days.

(21) Appl. No.: 11/855,848

(22) Filed: Sep. 14, 2007

(51) Int. Cl.
H03B 1/00 (2006.01)
H03K 3/03 (2006.01)

(52) U.S. Cl. .......................... 331/64; 331/57; 331/56; 331/185; 323/284

(58) Field of Classification Search .................. 331/57, 331/46, 48, 56, 177 R, 34, 185; 327/40, 327/261, 269, 291, 295, 157, 158; 324/76.18, 324/76.41; 323/282, 284
See application file for complete search history.

(56) References Cited

U.S. PATENT DOCUMENTS

| | | | |
|---|---|---|---|
| 4,164,648 A | 8/1979 | Chu | |
| 4,298,898 A | 11/1981 | Cardot | |
| 4,675,617 A | 6/1987 | Martin | |
| 4,737,670 A | 4/1988 | Chan | |
| 4,822,144 A | 4/1989 | Vriens | |
| 4,922,141 A | 5/1990 | Lofgren et al. | |
| 5,146,121 A | 9/1992 | Searles et al. | |
| 5,386,187 A | 1/1995 | Bichler et al. | |
| 5,440,250 A | 8/1995 | Albert | |
| 5,440,520 A | 8/1995 | Schutz et al. | |
| 5,446,718 A | 8/1995 | Shimizu et al. | |
| 5,459,438 A * | 10/1995 | Mirow .................. | 331/137 |
| 5,479,119 A | 12/1995 | Tice et al. | |
| 5,612,610 A | 3/1997 | Borghi et al. | |
| 5,629,610 A | 5/1997 | Pedrazzini et al. | |
| 5,638,019 A | 6/1997 | Frankeny | |
| 5,640,383 A | 6/1997 | Kamoto et al. | |
| 5,661,422 A | 8/1997 | Tice et al. | |
| 5,717,683 A | 2/1998 | Yoshimoto et al. | |
| 5,747,976 A | 5/1998 | Wong et al. | |
| 5,748,050 A | 5/1998 | Anderson | |
| 5,777,567 A | 7/1998 | Murata et al. | |
| 5,787,292 A | 7/1998 | Ottesen et al. | |
| 5,808,455 A | 9/1998 | Schwartz et al. | |

(Continued)

FOREIGN PATENT DOCUMENTS

WO    WO 09/13079 A1    11/1990

(Continued)

OTHER PUBLICATIONS

Lu Yun, et al., "A Current Steering Logic Based Ring Oscillator for High Stability and Lower Noise Applications", High Density packaging and Microsystem Integration, 2007. HDP '07. International Symposium on, Jun. 26-28, 2007, pp. 1-3.*

(Continued)

*Primary Examiner*—Robert Pascal
*Assistant Examiner*—Ryan J Johnson

(57) ABSTRACT

Control circuitry is disclosed including an oscillator operable to generate an oscillator signal. A frequency of the oscillator signal increases as an amplitude of a first voltage increases up to a threshold, and the frequency of the oscillator signal decreases as an amplitude of the first voltage exceeds the threshold. The oscillator is operable to generate a foldover signal indicating when the frequency of the oscillator signal is decreasing due to the first voltage exceeding the threshold.

17 Claims, 10 Drawing Sheets

U.S. PATENT DOCUMENTS

| | | | |
|---|---|---|---|
| 5,815,043 A * | 9/1998 | Chow et al. | 331/57 |
| 5,994,885 A | 11/1999 | Wilcox et al. | |
| 6,031,426 A | 2/2000 | Yechuri | |
| 6,055,287 A | 4/2000 | McEwan | |
| 6,125,157 A | 9/2000 | Donnelly et al. | |
| 6,157,247 A | 12/2000 | Abdesselem et al. | |
| 6,188,206 B1 | 2/2001 | Nguyen et al. | |
| 6,259,293 B1 | 7/2001 | Hayase et al. | |
| 6,259,327 B1 | 7/2001 | Balistreri et al. | |
| 6,285,263 B1 | 9/2001 | Anderson | |
| 6,288,524 B1 | 9/2001 | Tsujimoto | |
| 6,333,652 B1 | 12/2001 | Iida et al. | |
| 6,356,062 B1 | 3/2002 | Elmhurst et al. | |
| 6,396,251 B2 | 5/2002 | Corva et al. | |
| 6,424,184 B1 | 7/2002 | Yamamoto et al. | |
| 6,425,086 B1 | 7/2002 | Clark et al. | |
| 6,449,110 B1 | 9/2002 | DeGroat et al. | |
| 6,449,575 B2 | 9/2002 | Bausch et al. | |
| 6,515,460 B1 | 2/2003 | Farrenkopf | |
| 6,525,585 B1 | 2/2003 | Iida et al. | |
| 6,535,735 B2 | 3/2003 | Underbrink et al. | |
| 6,577,535 B2 | 6/2003 | Pasternak | |
| 6,617,936 B2 | 9/2003 | Dally et al. | |
| 6,622,252 B1 | 9/2003 | Klaassen et al. | |
| 6,657,467 B2 | 12/2003 | Seki et al. | |
| 6,693,473 B2 | 2/2004 | Alexander et al. | |
| 6,721,255 B1 | 4/2004 | Gushima et al. | |
| 6,774,694 B1 | 8/2004 | Stern et al. | |
| 6,831,494 B1 | 12/2004 | Fu et al. | |
| 6,868,503 B1 | 3/2005 | Maksimovic et al. | |
| 6,870,410 B1 | 3/2005 | Doyle et al. | |
| 6,885,210 B1 | 4/2005 | Suzuki | |
| 6,909,266 B2 | 6/2005 | Kernahan et al. | |
| 6,970,045 B1 * | 11/2005 | Lichter et al. | 331/2 |
| 6,987,380 B1 | 1/2006 | Lee | |
| 7,015,735 B2 | 3/2006 | Kimura et al. | |
| 7,042,202 B2 | 5/2006 | Sutardja et al. | |
| 7,061,292 B2 | 6/2006 | Maksimovic et al. | |
| 7,102,446 B1 | 9/2006 | Lee et al. | |
| 7,109,695 B2 | 9/2006 | King | |
| 7,129,763 B1 | 10/2006 | Bennett et al. | |
| 7,151,417 B1 * | 12/2006 | Suzuki | 331/185 |
| 7,176,663 B2 | 2/2007 | Takimoto et al. | |
| 7,205,805 B1 * | 4/2007 | Bennett | 327/158 |
| 7,259,603 B2 | 8/2007 | Gibson et al. | |
| 7,276,925 B2 * | 10/2007 | Dobberpuhl et al. | 324/763 |
| 7,330,017 B2 | 2/2008 | Dwarakanath | |
| 7,330,019 B1 | 2/2008 | Bennett | |
| 7,486,060 B1 | 2/2009 | Bennett | |
| 7,551,383 B1 | 6/2009 | Kupferman | |
| 2003/0093160 A1 | 5/2003 | Maksimovic et al. | |
| 2004/0257056 A1 | 12/2004 | Huang et al. | |
| 2005/0099235 A1 | 5/2005 | Sakamoto | |
| 2005/0134391 A1 | 6/2005 | Kimura et al. | |
| 2005/0140418 A1 | 6/2005 | Muniandy et al. | |
| 2005/0218871 A1 | 10/2005 | Kang et al. | |
| 2005/0218877 A1 | 10/2005 | Oswald et al. | |
| 2005/0251700 A1 | 11/2005 | Henderson | |
| 2006/0129852 A1 | 6/2006 | Bonola et al. | |
| 2006/0161678 A1 | 7/2006 | Bopardikar et al. | |
| 2006/0220753 A1 * | 10/2006 | Boerstler et al. | 331/46 |
| 2006/0227861 A1 | 10/2006 | Maksimovic et al. | |

FOREIGN PATENT DOCUMENTS

| | | |
|---|---|---|
| WO | WO 90/13079 A1 | 11/1990 |

OTHER PUBLICATIONS

Moore, B., et al., "Design of wireless sub-micron characterization system", VLSI Test Symposium, 2004. Proceedings. 22nd IEEE, Apr. 25-29, 2004, pp. 341-346.*

Boit, et al., Interaction of Laser Beam with Semiconductor Device (IC), Retrieved Jan. 29, 2009 from http://mikro.ee.tu-berlin.de/hIb/emmi/poster_emmi1.pdf.*

Wang et al., "Technology Challenges Motivating Adaptive Techniques", Adaptive Techniques for Dynamic Processor Optimization, Spring US, ISSN 1558-9412, 2008, pp. 1-23.*

Wei, Gu-Yeon, "Energy-Efficient I/O Interface Design With Adaptive Power-Supply Regulation", A Dissertation Submitted to the Department of Electrical Engineering and the Committee on Graduate Studies of Stanford University, Jun. 2001, retrieved from http://www-vlsi.stanford.edu/papers/gyw_thesis.pdf on Jan. 29, 2009.*

Application as filed—U.S. Appl. No. 11/393,425, filed Mar. 30, 2006, 18 pages.

Application as filed—U.S. Appl. No. 11/590,704, filed Oct. 31, 2006, 24 pages.

Gu-Yeon Wei et al., "A Fully Digital, Energy-Efficient, Adaptive Power-Supply Regulator", IEEE Journal of Solid-State Circuits, vol. 34, No. 4, pp. 520-528, Apr. 1999.

T. D. Burd, et al., "A Dynamic Voltage Scaled Microprocessor System," IEEE Journal of Solid-State Circuits, vol. 35, No. 11, pp. 1571-1580, Nov. 2000.

Anthony John Stratakos, "High-Efficiency Low-Voltage DC-DC Conversion for Portable Applications," pp. 1, 124-129, 177-183, 188-191, Ph.D. Dissertation, University of California, Berkley, Dec. 1998.

Aleksandar Prodic, et al., "Mixed-Signal Simulation of Digitally Controlled Switching Converters," IEEE COMPEL, pp. 100-105, Jun. 2002.

Jinwen Xiao, et al., "A 4-μA Quiescent-Current Dual-Mode Digitally Controlled Buck Converter IC for Cellular Phone Applications," IEEE Journal of Solid-State Circuits, vol. 39, No. 12, pp. 2342-2348, Dec. 2004.

Shamim Choudhury, "Designing a TMS320F280x Based Digitally Controlled DC-DC Switching Power Supply," Texas Instruments Application Report, http://focus.ti.com, spraab3.pdf, pp. 1-16, Jul. 2005.

Marc Fleischmann, "LongRun Power Management, Dynamic Power Management for Crusoe Processors," Transmeta Corporation, pp. 1-18, Jan. 17, 2001.

Alexander Klaiber, "The Technology Behind Crusoe Processors, Low-Power x86-Compatible Processors Implemented with Code Morphing Software," Transmeta Corporation, pp. 1-18, Jan. 2000.

"Applications for White LED Driver in Parallel vs. Series," Analog Integrations Corporation (AIC), AIC1845, AN027, www.analog.com, pp. 1-7, Oct. 2003.

"Power Supply Regulation," printout from Altera website, http://www.altera.com/support/devices/power/regulators/powregulators.html, pp. 1-3, Oct. 2006.

* cited by examiner

OSCILLATOR COMPRISING FOLDOVER DETECTION

BACKGROUND

1. Field

The present invention relates to oscillators. In particular, the present invention relates to an oscillator comprising foldover detection.

2. Description of the Related Art

Oscillators are employed in various applications, such as in the communications and storage industries. For example, prior art switching voltage regulators (such as discontinuous buck voltage regulators) may implement dynamic voltage scaling in order to optimize power consumption by using critical path gate speed as the feedback for switching control. A ring oscillator generates an oscillator signal with a frequency proportional to the gate speed of a critical path circuit (where the gate speed is inversely proportional to the propagation delay of the critical path circuit). The error between the oscillator frequency and a reference frequency represents the gate speed error used as feedback for switching control. In a discontinuous buck mode voltage regulator, an inductor charge cycle is triggered when the oscillator frequency falls below the reference frequency. Dynamic voltage scaling may be employed in any suitable application, for example, to optimize power consumption of a microprocessor that is configured to operate at different speeds depending on software dynamics, load dynamics, etc. Oscillators may also be employed in other circuits, such as a phase-locked loop (PLL).

SUMMARY OF THE EMBODIMENTS OF THE INVENTION

An embodiment of the present invention comprises control circuitry including an oscillator operable to generate an oscillator signal. A frequency of the oscillator signal increases as an amplitude of a first voltage increases up to a threshold, and the frequency of the oscillator signal decreases as an amplitude of the first voltage exceeds the threshold. The oscillator is operable to generate a foldover signal indicating when the frequency of the oscillator signal is decreasing due to the first voltage exceeding the threshold.

In one embodiment, the oscillator comprises a first ring oscillator operable to generate a first oscillating signal in response to the first voltage, and a second ring oscillator operable to generate a second oscillating signal in response to a second voltage less than the first voltage. In one embodiment, the oscillator generates the foldover signal by comparing the first oscillating signal to the second oscillating signal, and in one embodiment, the oscillator generates the foldover signal by comparing a cycle of the first oscillating signal to a cycle of the second oscillating signal.

In another embodiment, the oscillator comprises a first ring oscillator comprising a first number of inverters, and a second ring oscillator comprising a second number inverters less than the first number of inverters.

In yet another embodiment, the control circuitry further comprises a switching voltage regulator for regulating a voltage supplied to system circuitry. The oscillator signal represents a gate speed of a reference circuit in the system circuitry, and the switching voltage regulator comprises switching circuitry operable to charge a charging element in response to the oscillator signal and the foldover signal.

In still another embodiment, the control circuitry comprises a difference circuit for generating an error signal representing a difference between the oscillator signal and a reference frequency. In one embodiment, the control circuitry further comprises an integrator for integrating the error signal to generate a control signal, and a voltage regulator for adjusting the supply voltage in response to the control signal. In one embodiment, the foldover signal disables the control signal.

Another embodiment of the present invention comprises a method of generating an oscillator signal, wherein a frequency of the oscillator signal increases as an amplitude of a first voltage increases up to a threshold, and the frequency of the oscillator signal decreases as an amplitude of the first voltage exceeds the threshold, the method comprising generating a foldover signal indicating when the frequency of the oscillator signal is decreasing due to the first voltage exceeding the threshold.

DETAILED DESCRIPTION OF EMBODIMENTS OF THE INVENTION

Figure 1A:
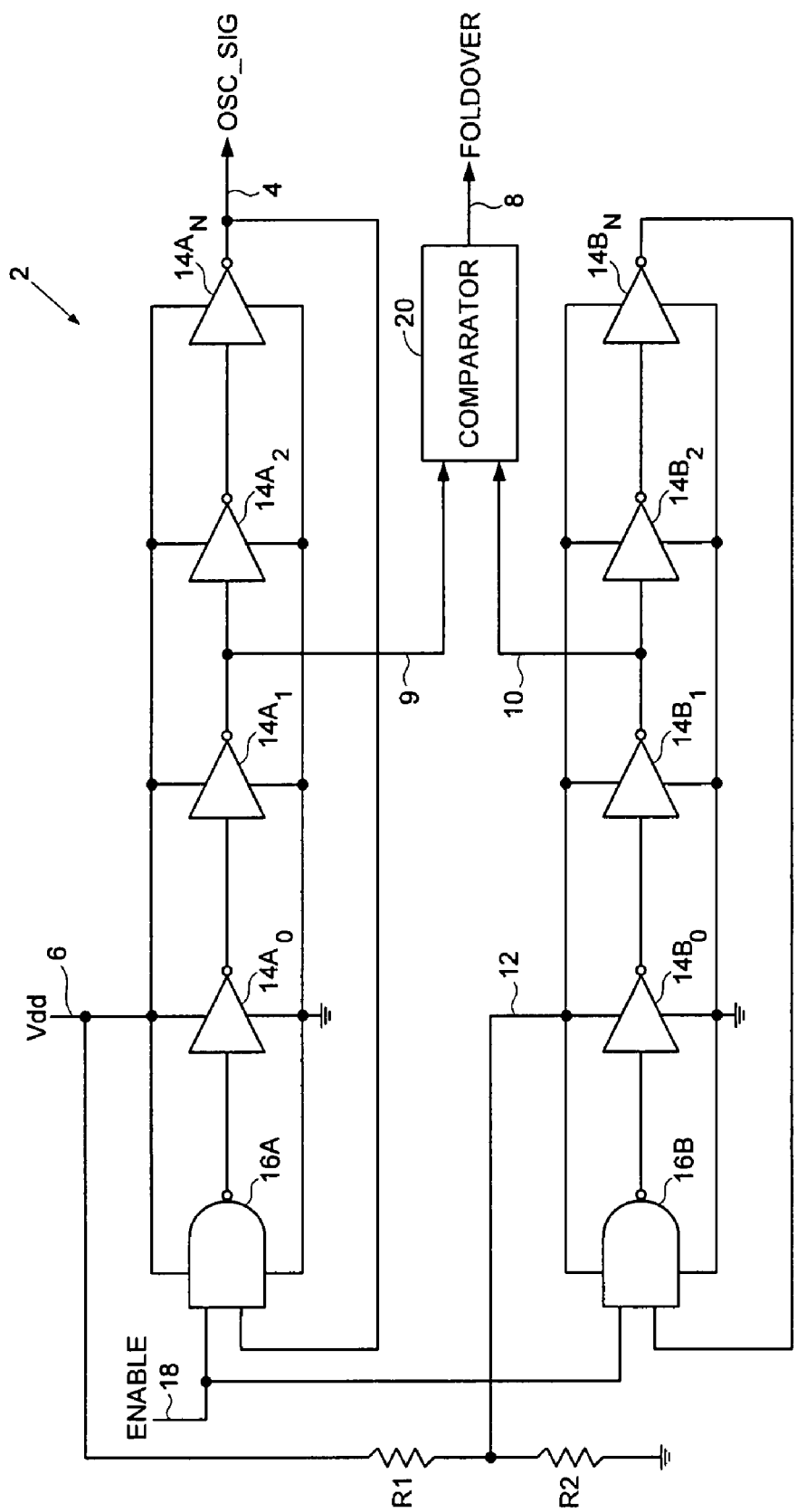
FIG. 1A shows an oscillator according to an embodiment of the present invention that generates a foldover signal indicating when the frequency of the oscillator signal is decreasing due to a supply voltage exceeding a threshold.

FIG. 1A shows control circuitry according to an embodiment of the present invention comprising an oscillator 2 operable to generate an oscillator signal 4. A frequency of the oscillator signal 4 increases as an amplitude of a first voltage 6 increases up to a threshold, and the frequency of the oscillator signal 4 decreases as an amplitude of the first voltage 6 exceeds the threshold. The oscillator 2 is operable to generate a foldover signal 8 indicating when the frequency of the oscillator signal 4 is decreasing due to the first voltage 6 exceeding the threshold.

Any suitable circuitry may be employed to implement the oscillator 2. In the embodiment of FIG. 1A, the oscillator 2 comprises a first ring oscillator operable to generate a first oscillating signal 9 in response to the first voltage 6, and a second ring oscillator operable to generate a second oscillating signal 10 in response to a second voltage 12 less than the first voltage 6.

In the embodiment of FIG. 1A, the first and second ring oscillators comprise a plurality of inverters $14_0$-$14_N$ connected in a ring configuration and an NAND gate 16 for enabling the ring oscillator in response to an enable signal 18. The frequency of the oscillating signals 9 and 10 depends on the number of inverters $14_0$-$14_N$, the amplitude of the voltages 6 and 12, and other factors, such as variations in fabrication process, ambient temperature, etc.

Figure 1B:
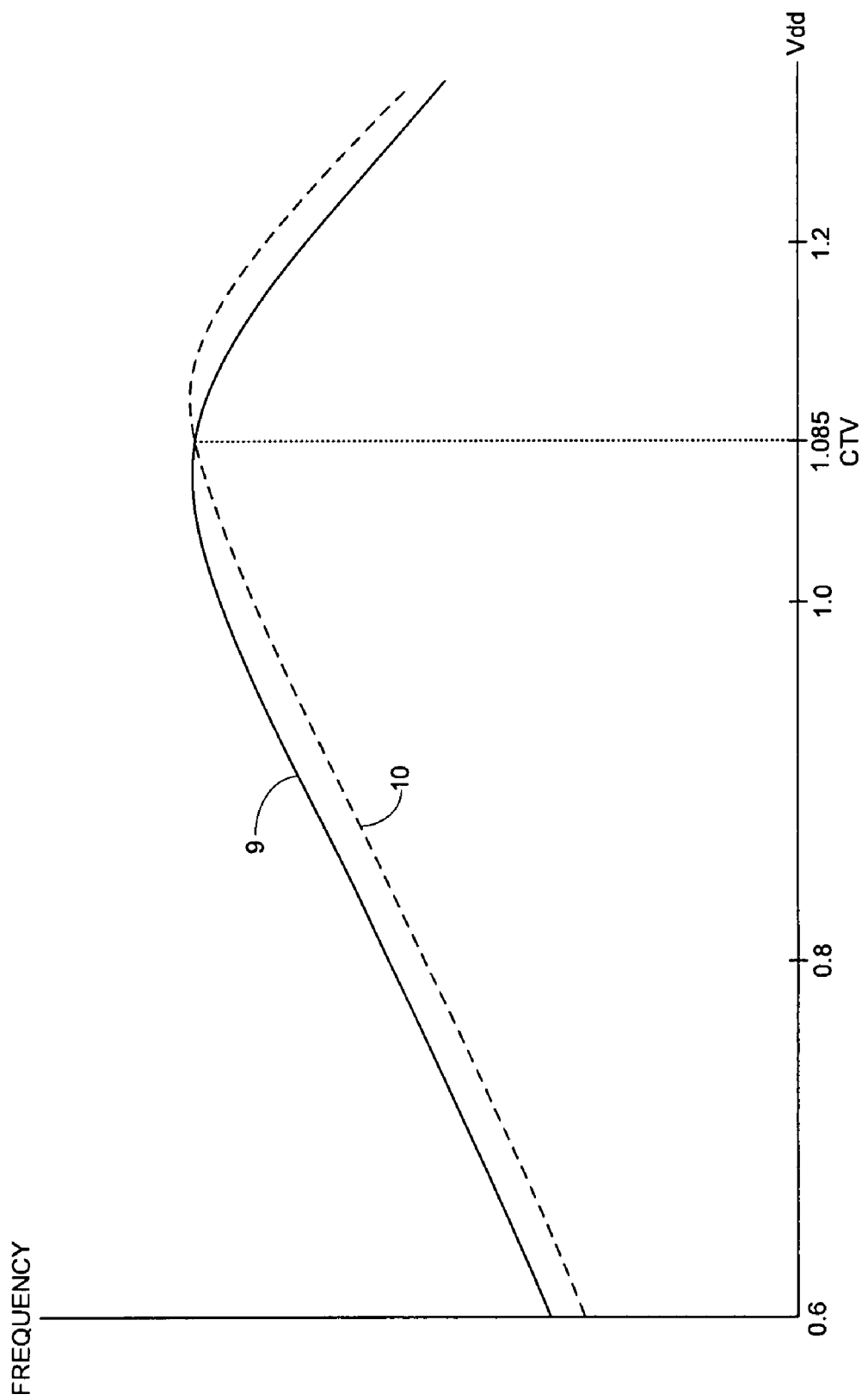
FIG. 1B illustrates an example of how the frequency of the oscillator signal folds over and begins decreasing once the supply voltage exceeds a threshold, and how the foldover occurs at a higher threshold for a ring oscillator having a lower supply voltage.

FIG. 1B shows an example of how the frequency of the oscillating signals 9 and 10 will increase as the first voltage 6 increases and eventually fold over and start decreasing when the first voltage 6 reaches a threshold. In the embodiment of FIG. 1A, the second oscillating signal 10 begins decreasing at a higher first voltage 6 since the second voltage 12 is less than the first voltage 6, therefore the foldover of the oscillator signal 4 can be detected when the frequency of the first oscillating signal 9 falls below the frequency of the second oscillating signal 10 (referred to as the crossover threshold voltage or CTV). The embodiment of FIG. 1A comprises a suitable comparator 20 for comparing the first oscillating signal 9 to the second oscillating signal 10 to generate the foldover signal 8. Also in the embodiment of FIG. 1A, the second voltage 12 is generated by voltage dividing the first voltage 6 so that the first and second voltages vary proportionally.

In the embodiment of FIG. 1A, the first and second oscillating signals 9 and 10 are selected as the output of an intermediate inverter (inverter $14_1$) to account for the delay of the comparator 20. That is, the intermediate inverter may be selected so that the foldover signal 8 is generated prior to the first rising edge of the oscillator signal 4.

Figure 2A:
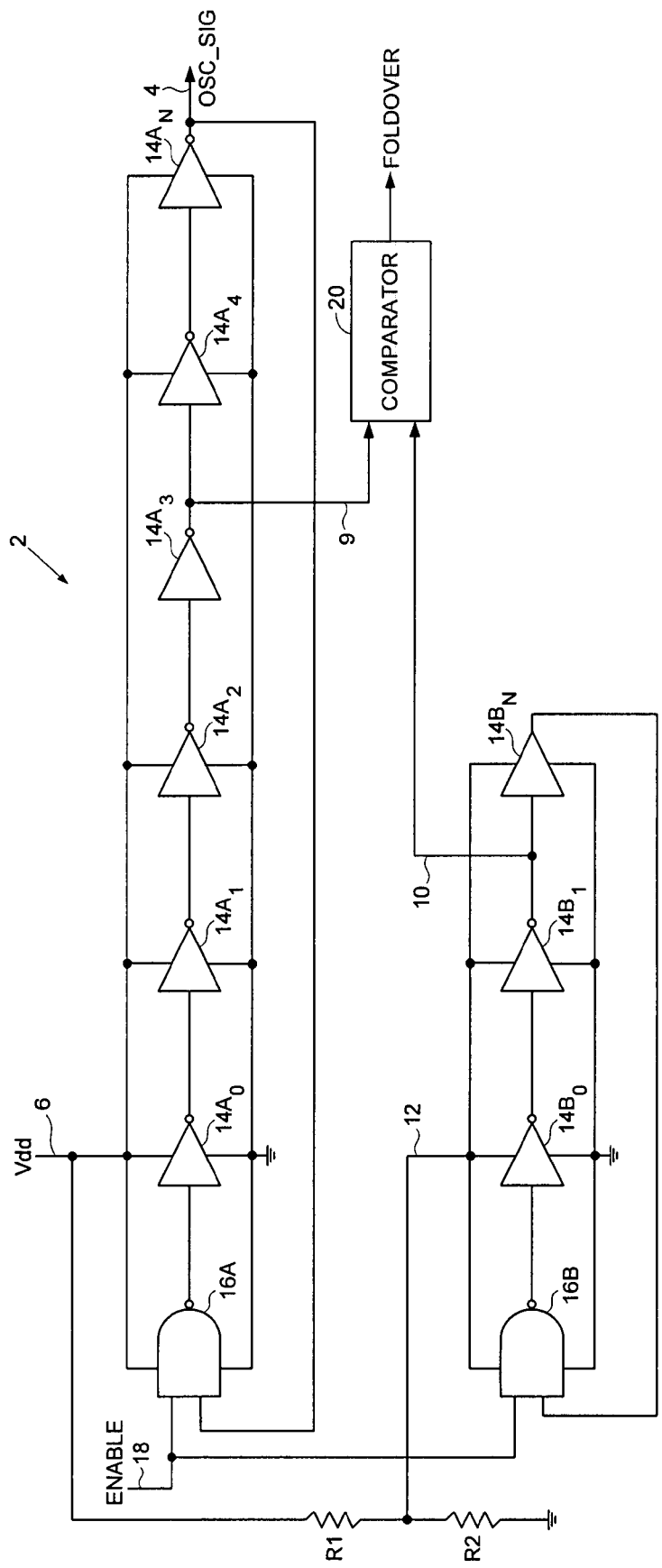
FIG. 2A shows an oscillator according to an embodiment of the present invention comprising a first oscillator and a second oscillator, wherein the first oscillator comprises more inverter stages than the second oscillator.
Figure 2B:
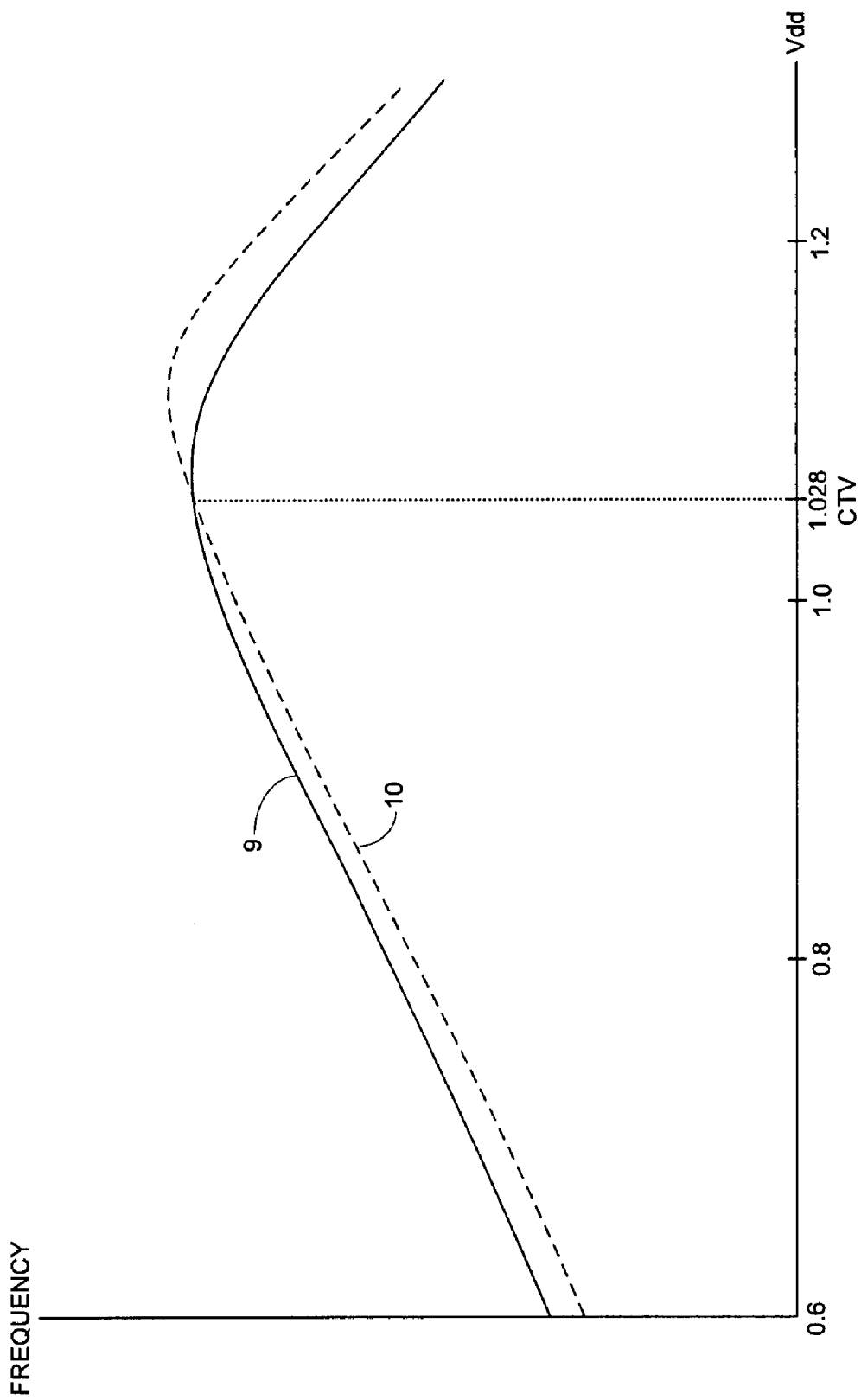
FIG. 2B shows an example of the effect on the frequency vs supply voltage for the second oscillator of FIG. 2A.

FIG. 2A shows an alternative embodiment wherein the first oscillator comprises more inverters 14 than the second oscillator, and the second oscillating signal 10 is selected at an earlier inverter stage. FIG. 2B shows an example of the effect on the frequency vs voltage for the second oscillating signal 10 as increasing the foldover voltage threshold as well as the corresponding maximum frequency. This embodiment helps ensure the foldover of the first oscillating signal 9 is detected before its frequency begins decreasing by reducing the CTV. This is illustrated in the figures wherein the CTV has been reduced from 1.085 v in FIG. 1B to 1.028 v in FIG. 2B.

Figure 3A:
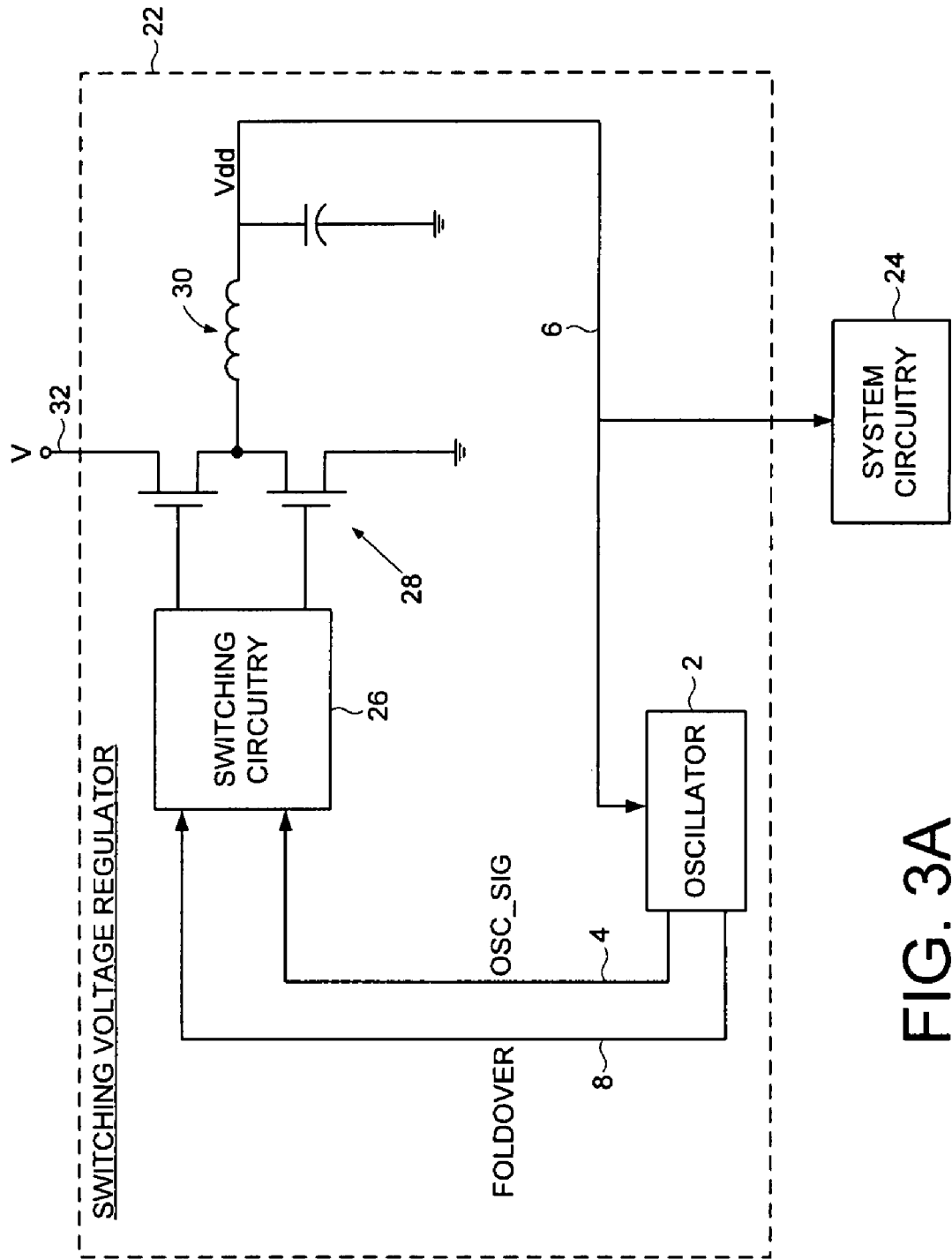
FIG. 3A shows an embodiment of the present invention comprising a switching voltage regulator employing an oscillator that generates a foldover signal.

The control circuitry employing the oscillator 2 in the embodiments of the present invention may comprise any suitable circuitry in any suitable application. FIG. 3A shows an embodiment wherein the control circuitry comprises a switching voltage regulator 22 for regulating a voltage 6 supplied to system circuitry 24. The switching voltage regulator 22 comprises the oscillator 2 operable to generate the oscillator signal 4 which in this embodiment represents a gate speed of a reference circuit in the system circuitry 24. Switching circuitry 26 controls the operation of switches 28 to charge a charging element 30 in response to the oscillator signal 4 and the foldover signal 8. In one embodiment, when the foldover signal 8 is activated, the switching circuitry 26 disconnects the charging element 30 from the charging voltage 32.

Figure 3B:
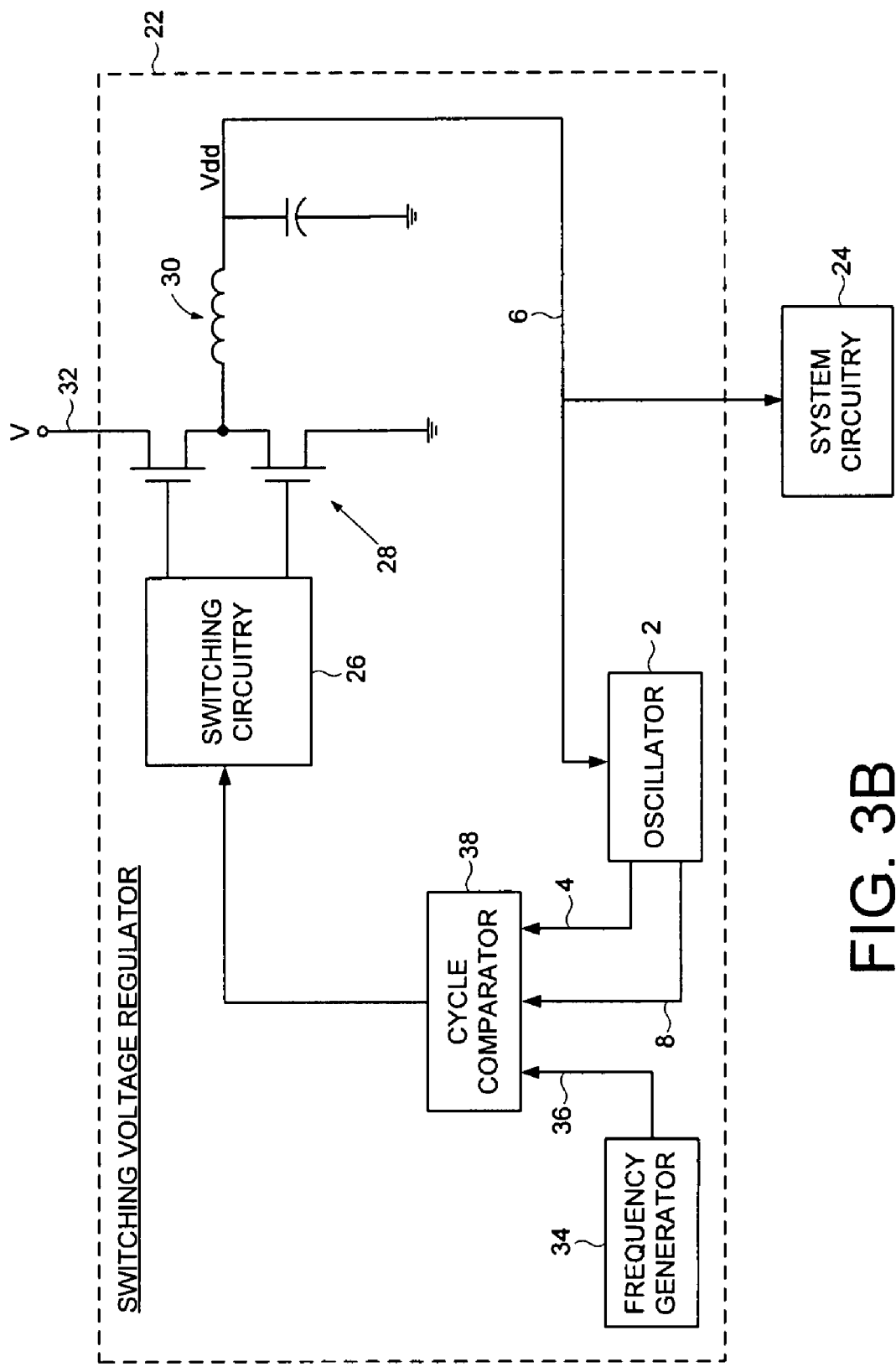
FIG. 3B shows an embodiment of the present invention wherein the switching circuitry of the voltage regulator is responsive to a difference between a cycle of the oscillator signal and a cycle of a reference frequency.

FIG. 3B shows an embodiment wherein the switching voltage regulator 22 comprises a frequency generator 34 operable to generate a reference signal 36 representing a target gate speed of the reference circuit. A cycle comparator 38 compares at least one cycle of the oscillator signal 4 to at least one cycle of the reference signal 36, and the switching circuitry 26 charges the charging element 30 in response to the comparison.

Any suitable charging element (e.g., an inductor, a capacitor, etc.) may be employed in embodiments of the present invention with any suitable switching voltage regulator configuration. In the embodiment of FIGS. 3A and 3B, a buck mode voltage regulator is shown employing an inductor 30 as the charging element. In other embodiments, the switching voltage regulator may include a boost mode voltage regulator, or a buck/boost mode voltage regulator. In addition, the physical location of the elements comprising the switching voltage regulator is unimportant. For example, in certain embodiments, the oscillator 2 may be located on a separate chip from the system circuitry 24. In other embodiments, the inductor 30 may be located separately from digital circuitry comprising portions of the switching voltage regulator. Furthermore, the system circuitry 24 may comprise any circuitry supplied by a voltage. In one embodiment, the system circuitry 24 may comprise a microprocessor, as would be typically found in a computer. In another embodiment, the system circuitry 24 may comprise analog circuitry configured to perform one or more tasks.

In one embodiment, the oscillator 2 is configurable to represent one of a plurality of different circuits (or circuit paths) within the system circuitry 24 depending on a mode of operation (i.e., the reference circuit may be different circuits at different times). Moreover, the oscillator frequency need not correspond precisely with the gate speed of the reference circuit, but may instead simply track it (e.g., the oscillator frequency may be a multiple of the corresponding gate speed-equivalent frequency of the reference circuit). In a preferred embodiment, the oscillator frequency is directly proportional to the gate speed of the reference circuit. Since the oscillator frequency will vary relative to the magnitude of the supply voltage 6 as well as other factors, such as temperature, adjusting the magnitude of the supply voltage 6 adjusts the frequency of the oscillator signal 4 until the reference circuit is operating at the desired gate speed.

The simulation and layout software used in the design of the system circuitry 24 may provide sophisticated timing analysis of various delays. In one embodiment, the reference circuit within the system circuitry 24 is determined at design time using the simulation and layout software. The gates in the oscillator 2 and system circuitry 24 may be fabricated together so they have similar characteristics. Some differences may occur due to loading effects and wire routing; however, by adding inverters, lengthening wires through physical placement, adding dummy loads, and placing the oscillator 2 as close as possible to the reference circuit, the oscillator 2 may be configured to substantially match the delay of the reference circuit. The oscillator 2 will change speed as the temperature changes, as the supply voltage 6 changes, or as the manufacturing process produces faster or slower gates, and thereby track the propagation delay of the reference circuit within the system circuitry 24.

Figure 4A:
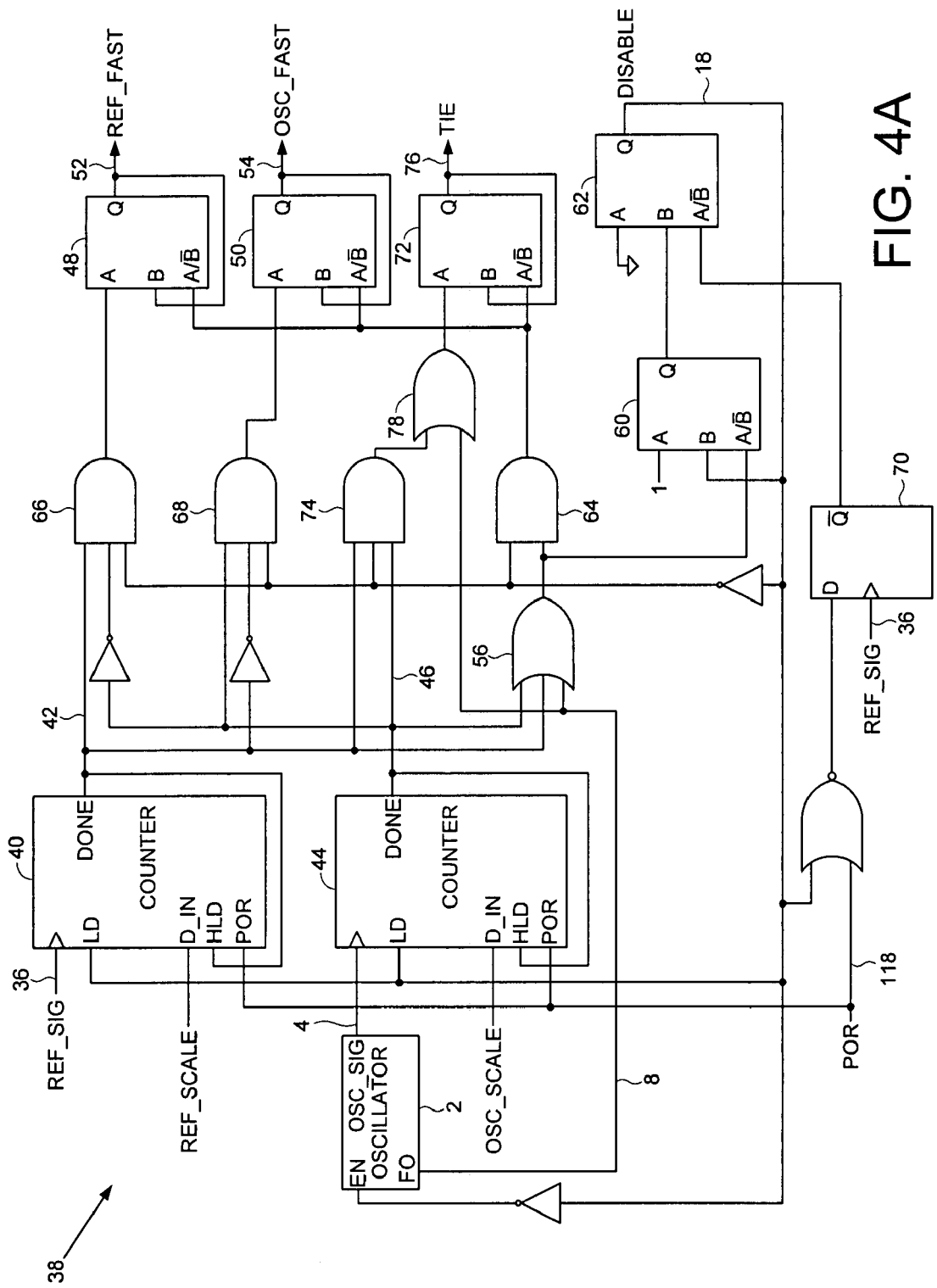
FIG. 4A shows a cycle comparator according to an embodiment of the present invention for comparing a cycle of the oscillator signal to a cycle of a reference frequency.

FIG. 4A shows an example embodiment of a cycle comparator 38 for comparing at least one cycle of the oscillator signal 4 to at least one cycle of the reference signal 36. The cycle comparator 38 comprises a first register 40 (e.g., a first counter) clocked by the reference signal 36, wherein the first register 40 asserts a first signal 42 at the end of the reference cycle, and a second register 44 (e.g., a second counter) clocked by the oscillator signal 4, wherein the second register 44 asserts a second signal 46 at the end of the oscillator cycle. The cycle comparator 38 further comprises a latch 48 for latching the first signal 42 if generated before the second signal 46, and a latch 50 for latching the second signal 46 if generated before the first signal 42. Latch 48 thus outputs a reference fast (REF_FAST) signal 52 indicating when the reference signal 36 is oscillating faster than the oscillator signal 4, and latch 50 outputs an oscillator fast (OSC_FAST) signal 54 when the oscillator signal 4 is oscillating faster than the reference signal 36.

When either the first or second signals 42 or 46 is triggered and latches 48 or 50 have captured whichever signal arrived first, an OR gate 56 asserts a disable signal 18 through latches 60 and 62. The disable signal 18 latches the outputs of latches 48 and 50 through AND gate 64, and disables the latches 48 and 50 through AND gates 66 and 68 until the next sample period. The disable signal 18 also disables the oscillator 2 and loads the counters 40 and 44 with appropriate starting values. A register 70 resets the disable signal 18 when clocked by the reference signal 36 to thereby synchronize the oscillator 2 and the frequency generator 34.

In one embodiment, the cycle comparator 38 compares one cycle of the oscillator signal 4 to one cycle of the reference signal 36. Because the cycle comparator 38 compares a cycle (or cycles) of the oscillator signal 4 to a cycle (or cycles) of the reference signal 36, as compared to computing a frequency difference using counters, the cycle comparator 38 may in some embodiments reduce the transport delay and quantization error, and thereby improve the transient response of the switching voltage regulator 22.

The counters 40 and 44 in the embodiment of FIG. 4A enable scaling of the oscillator frequency or the reference frequency. For example, if the frequency of the oscillator signal 4 should equal half the frequency of the reference signal 36, then counter 40 is loaded with a starting value that is twice the starting value loaded into counter 44, from which values the two counters count down at each cycle of the reference and oscillator signals. In another embodiment, the cycle comparator 38 compares multiple cycles of the oscillator signal 4 and reference signal 36 in order to improve the accuracy of the measurement, for example, by compensating for startup transient errors of the ring oscillator 2. For example, in one embodiment, counters 40 and 44 are loaded with a starting value of 2 in order to compare two cycles of the oscillator signal 4 to two cycles of the reference signal 36.

Depending on the speed requirements and circuit tolerances, a number of the components shown in FIG. 4A may be modified or eliminated while still performing the same cycle comparison function. In one embodiment, the counters 40 and 44 are implemented using simple registers for detecting a single cycle of the reference signal 36 and oscillator signal 4, respectively.

In yet another embodiment, the cycle comparator 38 comprises tie circuitry for preventing ambiguities in the comparison when the at least one cycle of the oscillator signal 4 substantially matches the at least one cycle of the reference signal 36. In one embodiment, the substantial match may be determined based on circuit characteristics of the tie circuitry, and may equal some percentage of the oscillator or reference cycles. Example tie circuitry is shown in FIG. 4A as comprising a latch 72 for latching the near simultaneous occurrence of both pulse signals 42 and 46 (through AND gate 74) and outputting a TIE signal 76.

In an embodiment, the foldover signal 8 generated by the oscillator 2 asserts the TIE signal 76 through OR gate 78 before either signal 42 or 46 triggers. As described below with reference to FIG. 5, asserting the TIE signal 76 prevents the switching circuitry from charging the charging element 30 or adjusting the charge time while the foldover signal 8 is active.

Figure 4B:
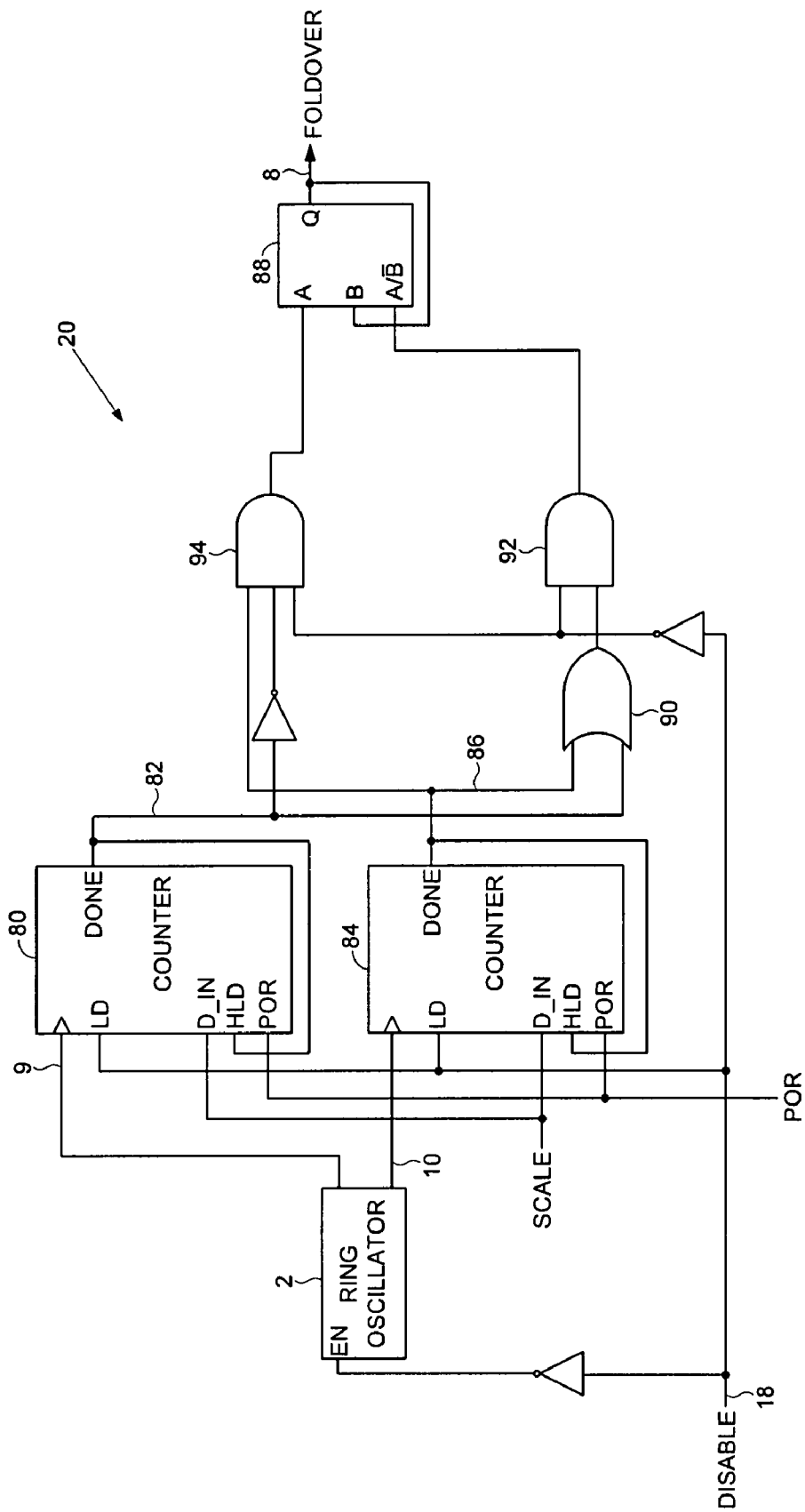
FIG. 4B shows an embodiment of the present invention wherein the foldover signal is generated by comparing the first oscillating signal to the second oscillating signal.

FIG. 4B shows an example embodiment of the comparator 20 employed in the oscillator 2 for comparing the first oscillating signal 9 to the second oscillating signal 10 to generate the foldover signal 8 (FIGS. 1A and 2A). Similar to the cycle comparator 38 of FIG. 3B, the comparator 20 circuitry shown in FIG. 4B compares a cycle (or cycles) of the first oscillating signal 9 to a cycle (or cycles) of the second oscillating signal 10. The comparator 20 comprises a first register 80 (e.g., a first counter) clocked by the first oscillating signal 9, wherein the first register 80 asserts a first signal 82 at the end of the cycle, and a second register 84 (e.g., a second counter) clocked by the second oscillating signal 10, wherein the second register 84 asserts a second signal 86 at the end of the cycle. The comparator 20 further comprises a latch 88 for latching the second signal 86 if generated before the first signal 82 and thus outputs the foldover signal 8 indicating when the second oscillating signal 10 is oscillating faster than the first oscillating signal 9. When either the first or second signals 82 or 86 is triggered and latch 88 has captured whichever signal arrived first, an OR gate 90 and the disable signal 18 latch the output of latch 88 through AND gate 92, and disables the latch 88 through AND gate 94 until the next sample period.

Figure 5:
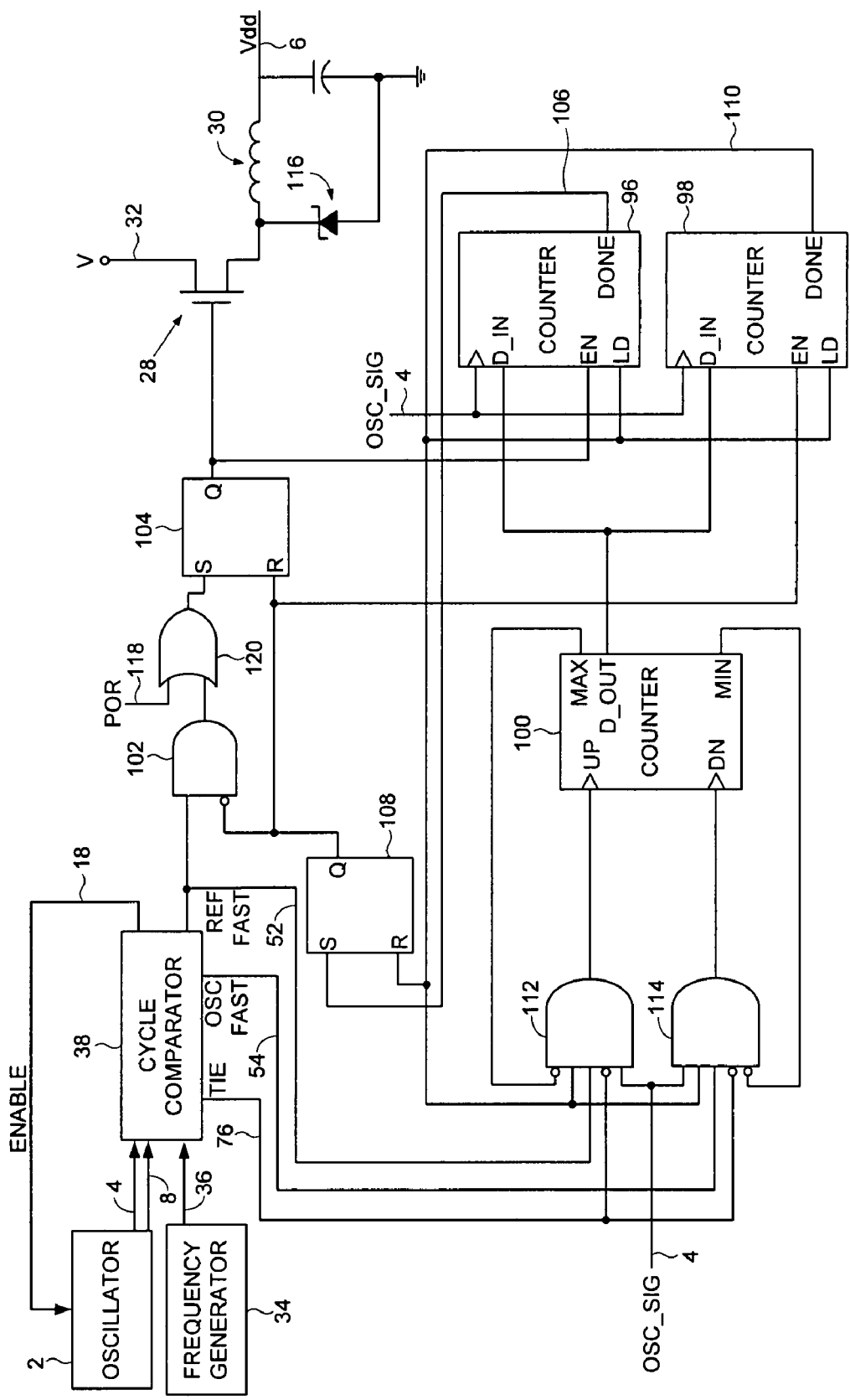
FIG. 5 shows a switching voltage regulator according to an embodiment of the present invention wherein a charging element is charged in response to the oscillator signal and the foldover signal.

FIG. 5 shows a switching voltage regulator employing an oscillator 2 and cycle comparator 38 according to an embodiment of the present invention. A first charging counter 96 times a charge time of the charging element 30, and a second charging counter 98 times a delay period following the charge time. The first and second charging counters 96 and 98 are loaded initially with a nominal value generated by a third counter 100. When the REF_FAST signal 52 is active (indicating that the output voltage 6 is too low), it enables AND gate 102 and sets register 104, thereby turning on switch 28 so as to charge the charging element 30. When the first charging counter 96 reaches a terminal count, it generates a DONE signal 106 that sets register 108 to disable AND gate 102 and reset register 104 in order to turn off the switch 28. Register 108 also enables the second charging counter 98 to begin counting.

When the second charging counter 98 reaches a terminal count, it generates a DONE signal 110 that resets register 108 to enable AND gate 102 and thereby enable the next charging cycle. The DONE signal 110 also enables AND gates 112 and 114 in order to "sample" the REF_FAST signal 52 and OSC_FAST signal 54 to make appropriate adjustments to the charging time. If the REF_FAST signal 52 is high after the delay period established by the second charging counter 98, it means that the charging time should be increased. Therefore AND gate 112 increments the third counter 100 so as to increment the charge time of the first charging counter 96 and the delay period of the second charging counter 98. If the OSC_FAST signal 54 is high after the delay period established by the second charging counter 98, it means the charging time should be decreased. Therefore, AND gate 114 decrements the third counter 100 so as to decrement the charge time of the first charging counter 96 and the delay period of the second charging counter 98. If the TIE signal 76 is high at the end of the delay period indicating the at least one cycle of the oscillator signal 4 substantially matches the at least one cycle of the reference signal 36, or that the foldover signal 8 is active, the TIE signal 76 disables AND gates 112 and 114 so that the third counter 100 remains the same.

The switching voltage regulator of FIG. 5 comprises a diode 116 that enables a recirculation current. In an alternative embodiment, the diode 116 of FIG. 5 is replaced with a conventional switch (e.g., a FET, as shown in FIG. 3B) to improve efficiency by avoiding the voltage drop of the diode 116. In one embodiment, a current detector is employed to turn off the switch (and enable the next charge cycle) once the current decays to zero.

In one embodiment, the switching voltage regulator comprises suitable circuitry to facilitate a startup operation during a power-on restart (POR) event. For example, in the embodiment of FIG. 5, a POR signal 118 enables the charge cycle through OR gate 120 regardless of the discharge level of the current in order to help maintain a sufficient output voltage 6 during the startup operation. Once the switching voltage regulator stabilizes, the POR signal 118 is disabled so that the regulator enters the discontinuous mode. In another embodiment, a separate oscillator driven by the input voltage 32 may generate the oscillator signal for clocking the first and second charging counters 96 and 98 of FIG. 5. This helps ensure that the charging counters 96 and 98 operate reliably during the startup operation since this separate oscillator is driven by the input voltage rather than by the output voltage 6.

In yet another embodiment, during the startup operation, the delay period generated by the second charging counter 98 may be increased in order to reduce the maximum current flowing through the switch 28 at the beginning of each charge cycle, thereby providing a current limit function to help protect the switch 28. The delay period generated by the second charging counter 98 may be increased in any suitable manner, for example, by loading the second charging counter 98 with a larger value, or by adjusting the clock speed of the second charging counter 98 while POR 118 is active.

Figure 6:
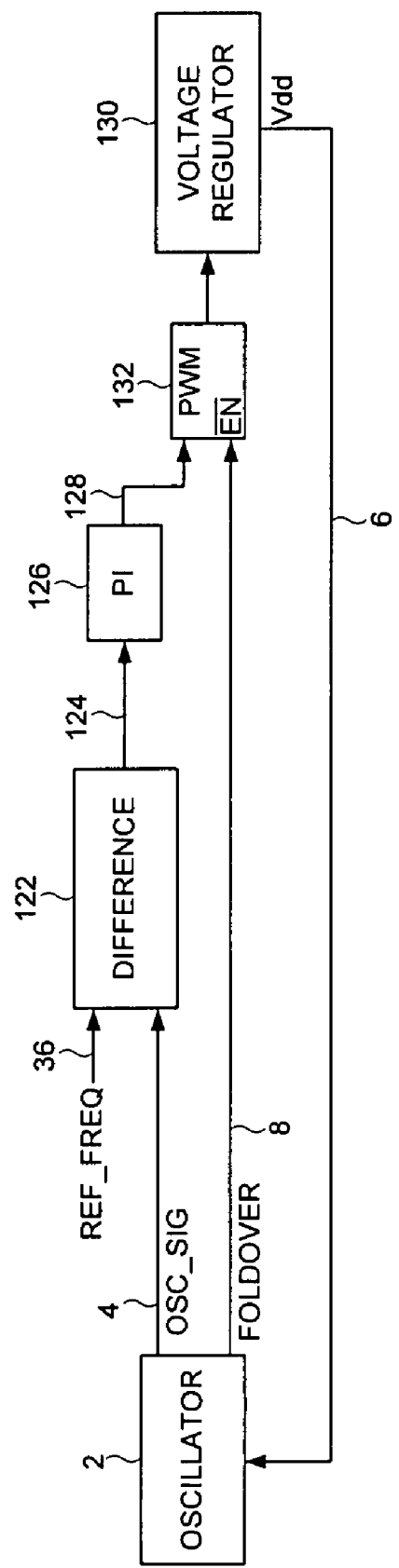
FIG. 6 shows an embodiment of the present invention wherein a voltage regulator generates a supply voltage adjusted in response to a control signal generated as a proportional-integral of an error signal generated as a difference between the oscillator signal and a reference frequency, wherein the control signal is disabled by the foldover signal.

FIG. 6 shows an embodiment of the present invention wherein the control circuitry comprises a difference circuit 122 for generating an error signal 124 representing a difference between the oscillator signal 4 and a reference signal 36. The difference circuit 122 may comprise any suitable circuitry, such as a pair of counters clocked by the oscillator signal 4 and the reference signal 36 respectively, wherein the difference between the counters represents the error signal 124 (frequency error). In another embodiment, the difference circuit 122 may comprise suitable analog circuitry for comparing a phase difference between the oscillator signal 4 and the reference signal 36.

Also in the embodiment of FIG. 6, the control circuitry comprises an integrator 126 for integrating the error signal 124 to generate a control signal 128. A voltage regulator 130 adjusts the supply voltage 6 in response to the control signal 128. For example, in the embodiment of FIG. 6, the control signal 128 adjusts a duty cycle of a pulse width modulator (PWM) 132 which in turn controls the amplitude of the supply voltage 6. When the foldover signal 8 is activated, it disables the control signal 128 (e.g., by disabling the PWM 132), thereby preventing further adjustments to the voltage regulator 130 without disabling the integrator 126. In the embodiment of FIG. 6, the error signal 124 is further adjusted by a proportional scalar in addition to the integrator within circuitry 126 (i.e., a PI compensator). The embodiment of FIG. 6 may be used to implement any suitable control circuitry, such as dynamic voltage scaling or a phase-locked loop (PLL).

What is claimed is:

1. Control circuitry comprising an oscillator operable to generate an oscillator signal and a foldover detection circuit, wherein:
    a frequency of the oscillator signal increases as an amplitude of a first voltage increases up to a threshold;
    the frequency of the oscillator signal decreases as an amplitude of the first voltage exceeds the threshold; and
    the foldover detection circuit is operable to generate a foldover signal indicating when the frequency of the oscillator signal is decreasing due to the first voltage exceeding the threshold.

2. The control circuitry as recited in claim 1, wherein the oscillator comprises:
    a first ring oscillator operable to generate a first oscillating signal in response to the first voltage; and
    a second ring oscillator operable to generate a second oscillating signal in response to a second voltage less than the first voltage.

3. The control circuitry as recited in claim 2, wherein the foldover detection circuit generates the foldover signal by comparing the first oscillating signal to the second oscillating signal.

4. The control circuitry as recited in claim 3, wherein the foldover detection circuit generates the foldover signal by comparing a cycle of the first oscillating signal to a cycle of the second oscillating signal.

5. The control circuitry as recited in claim 1, wherein the oscillator comprises:
    a first ring oscillator comprising a first number of inverters; and
    a second ring oscillator comprising a second number inverters less than the first number of inverters.

6. The control circuitry as recited in claim 1, further comprising a switching voltage regulator for regulating a voltage supplied to system circuitry, wherein:
    the oscillator signal represents a gate speed of a reference circuit in the system circuitry; and
    the switching voltage regulator comprises switching circuitry operable to charge a charging element in response to the oscillator signal and the foldover signal.

7. The control circuitry as recited in claim 1, further comprising a difference circuit for generating an error signal representing a difference between the oscillator signal and a reference frequency.

8. The control circuitry as recited in claim 7, further comprising:
    an integrator for integrating the error signal to generate a control signal; and
    a voltage regulator for adjusting a supply voltage in response to the control signal.

9. The control circuitry as recited in claim 8, wherein the foldover signal disables the control signal.

10. A method of generating an oscillator signal, wherein a frequency of the oscillator signal increases as an amplitude of a first voltage increases up to a threshold, and the frequency of the oscillator signal decreases as an amplitude of the first voltage exceeds the threshold, the method comprising generating a foldover signal indicating when the frequency of the oscillator signal decreasing due to the first voltage exceeding the threshold is detected.

11. The method as recited in claim 10, further comprising:
    generating a first oscillating signal in response to the first voltage; and
    generating a second oscillating signal in response to a second voltage less than the first voltage.

12. The method as recited in claim 11, generating the foldover signal comprises comparing the first oscillating signal to the second oscillating signal.

13. The method as recited in claim 12, wherein generating the foldover signal comprises comparing a cycle of the first oscillating signal to a cycle of the second oscillating signal.

14. The method as recited in claim 10, wherein the oscillator signal represents a gate speed of a reference circuit in system circuitry, the method further comprising charging a charging element of a switching voltage regulator in response to the oscillator signal and the foldover signal to regulate a supply voltage.

15. The method as recited in claim 10, further comprising generating an error signal representing a difference between the oscillator signal and a reference frequency.

16. The method as recited in claim 15, further comprising:
integrating the error signal to generate a control signal; and
adjusting a supply voltage in response to the control signal.

17. The method as recited in claim 16, further comprising disabling the control signal in response to the foldover signal.

* * * * *